(12) United States Patent
Dietrich et al.

(10) Patent No.: US 6,359,832 B2
(45) Date of Patent: Mar. 19, 2002

(54) METHOD AND CIRCUIT CONFIGURATION FOR READ-WRITE MODE CONTROL OF A SYNCHRONOUS MEMORY

(75) Inventors: Stefan Dietrich, Türkenfeld; Sabine Schöniger, Hausham; Peter Schrögmeier; Christian Weis, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/773,222

(22) Filed: Jan. 31, 2001

(30) Foreign Application Priority Data

Jan. 31, 2000 (DE) .......................................... 100 04 110

(51) Int. Cl.$^7$ ................................................ G11C 8/00
(52) U.S. Cl. ................... 365/233; 365/203; 365/189.02
(58) Field of Search ........................... 365/233, 189.02, 365/203, 230.02

(56) References Cited

U.S. PATENT DOCUMENTS

| | | | |
|---|---|---|---|
| 5,587,961 A | 12/1996 | Wright et al. | |
| 5,600,605 A | * 2/1997 | Schaefer | ...................... 365/233 |
| 5,748,560 A | 5/1998 | Sawada | |
| 5,802,581 A | * 9/1998 | Nelsen | ........................ 711/151 |

* cited by examiner

*Primary Examiner*—Huan Hoang
(74) *Attorney, Agent, or Firm*—Herbert L. Lerner; Laurence A. Greenberg; Werner H. Stemer

(57) ABSTRACT

A read-write mode control method is described in which a waiting time during a reading process can be shortened by conducting a read instruction with auto-precharging in a first circuit part. The first circuit part is separate from a second circuit part used for conducting the write instruction, since a memory controller does not need to insert any wait cycles between a write instruction and an associated activate signal.

6 Claims, 3 Drawing Sheets

METHOD AND CIRCUIT CONFIGURATION FOR READ-WRITE MODE CONTROL OF A SYNCHRONOUS MEMORY

BACKGROUND OF THE INVENTION

Field of the Invention

The invention relates to a method and a circuit configuration for read-write mode control of a synchronous memory, especially a dynamic SDRAM or SGRAM, by using auto-precharging.

In synchronous memories, the times between applying control commands are decisive for their operation. Within certain instruction sequences, a memory controller has a waiting time of one to a number of clock cycles, the so-called no-operations (NOPs) until it can send the next write or read instruction to the control inputs of the memory from the outside. These waiting times are due to internal propagation times in the memory chip.

In the read-write mode control of synchronous memories hitherto used, the internal propagation times were identical for the write process and the read process during the auto-precharging. This leads to a certain number of wait clock cycles, the so-called NOPs being required in the instruction sequence applied to the memory from the outside which, as mentioned, were identical for the write and read case in the known synchronous memory chips.

The consequence is that waiting times between the instructions are also used where they are not absolutely necessary due to shorter internal propagation times in the memory chip.

SUMMARY OF THE INVENTION

It is accordingly an object of the invention to provide a method and a circuit configuration for read-write mode control of a synchronous memory which overcome the above-mentioned disadvantages of the prior art methods and devices of this general type, in which the number of clock cycles for a special instruction sequence for driving an SDRAM or SGRAM are reduced and thus the reading process is shortened, that is to say the memory chip is faster.

With the foregoing and other objects in view there is provided, in accordance with the invention, a method for read-write mode control of synchronous memories, including synchronous dynamic random access memories (SDRAMs) and synchronous graphics random access memories (SGRAMs). The method includes the steps of:

providing a synchronous memory having separate signal paths running in the synchronous memory for auto-precharging for a reading process and for the auto-precharging for a writing process; and setting an internal propagation time of an auto-precharging process for the writing process different than the internal propagation time for the reading process so that the auto-precharging is supplied as early as possible to a memory cell in a read operation.

According to the invention, the method achieving the object is characterized in that the signal paths for the auto-precharging during reading and writing are run separately in the memory. The internal propagation times of the auto-precharging process for writing and for reading are configured differently in order to supply the auto-precharge as early as possible to the memory cells during the reading process.

According to the invention, measures are thus taken for optimizing the internal propagation times of the memory chip to the extent that the auto-precharging takes place as early as possible for the read case. This shortens the waiting time, for the read case compared with the waiting time for the write case.

The resultant advantage is that waiting times between the instruction sequences are only accepted where they are absolutely necessary due to the internal propagation times in the memory chip. That is to say, the method and the circuit configuration set up for carrying out the method lead to shorter waiting times between the instructions applied to the memory chip from the outside in the read case compared with the write case due to the shorter internal propagation times during reading.

The method according to the invention is applied in synchronous dynamic memories such as DRAMs or SGRAMs which are combined in a memory bank/row/word line. In such synchronous dynamic memory banks, there is the possibility of automatically closing, after a write or read access, the memory bank in which the access took place. This is done by a read or write access with auto-precharging which automatically closes again the bank/row/word line after the read or write access. In conventional SDRAMs, this internal auto-precharge instruction is always executed after a fixed time after the read or write instruction.

In the case of SDRAMs or SGRAMs based on double data rate (DDR), this known concept can no longer be used since otherwise unnecessary losses in functionality would be the consequence (this would result in two clock cycles of additional waiting time in the read case). The read-write mode control method according to the invention, which distinguishes between read processes and write processes, thus offers the advantage of accelerating the automatic closing process of the bank for such memory banks/rows/word lines.

In accordance with an added mode of the invention, there is the step of providing no wait cycles between a read instruction and an associated activate signal during the read In accordance with an additional mode of the invention, there is the step of providing a number of wait cycles between a write instruction and an activate signal during a write operation.

In accordance with another mode of operation of the invention, there is the step of automatically closing a memory bank containing a number of synchronous memories in which a read-write access took place, by a read instruction with an earliest possible auto-precharge.

With the foregoing and other objects in view there is provided, in accordance with the invention, a circuit configuration for read-write mode control of a synchronous memory, including synchronous dynamic random access memories (SDRAMs) and synchronous graphics random access memories (SGRAMs). The circuit configuration includes a first circuit part for conducting and generating a first auto-precharging signal for a reading process, a second circuit part for conducting and generating a second auto-precharging signal for a writing process, and a multiplexer connected to the first circuit part and the second circuit part. The multiplexer combines the first auto-precharging signal and the second auto-precharging signal, which were generated and conducted separately, in temporally separated positions for supplying an auto-precharge signal to a memory cell without wait cycles during the reading process.

In accordance with a concomitant feature of the invention, a memory controller for inserting the wait cycles between a write instruction signal and an associated write activate signal during the writing process is provided. The memory controller is connected to the first circuit part and to the second circuit part.

Other features which are considered as characteristic for the invention are set forth in the appended claims.

Although the invention is illustrated and described herein as embodied in a method and a circuit configuration for read-write mode control of a synchronous memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
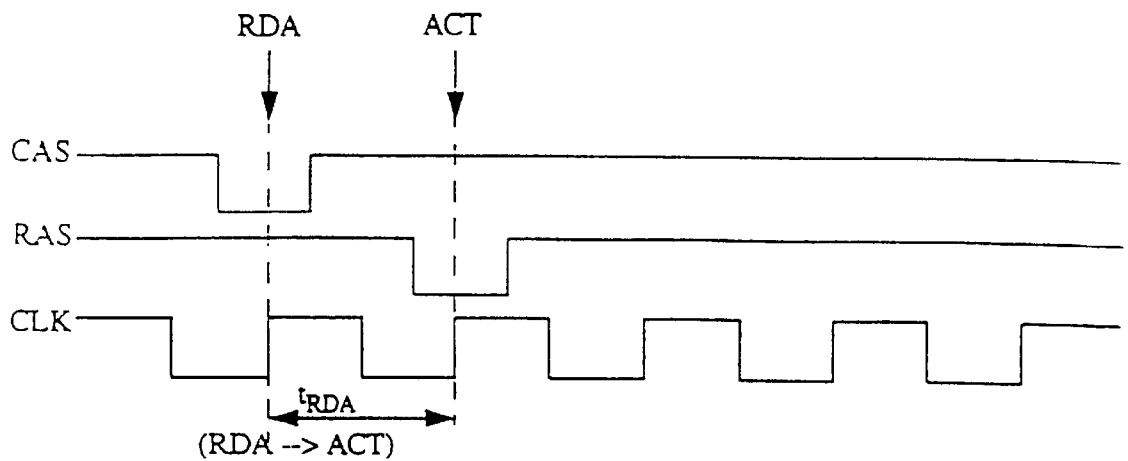
FIG. 1A is a pulse timing diagram for illustrating a time between reading with auto-precharging up to an associated activate instruction, provided in accordance with the method according to the invention.

In all the figures of the drawing, sub-features and integral parts that correspond to one another bear the same reference symbol in each case. Referring now to the figures of the drawing in detail and first, particularly, to FIG. 3 thereof, there is shown a timing diagram for explaining a memory read/write selection method for known SDRAMs or SGRAMs with auto-precharging. On a signal line CAS, a write signal WRA or a read signal RDA ("Write with auto-precharging" or "Read with auto-precharging") is present at a memory chip at time $t_0$. Following the write signal WRA or the read siganl RDA, in each case two NOPs are kept until an activate signal ACT is input to the memory chip on a signal line RAS. This results in a defined waiting time of three clock cycles (cycles of a clock signal CLK).

Figure 3:
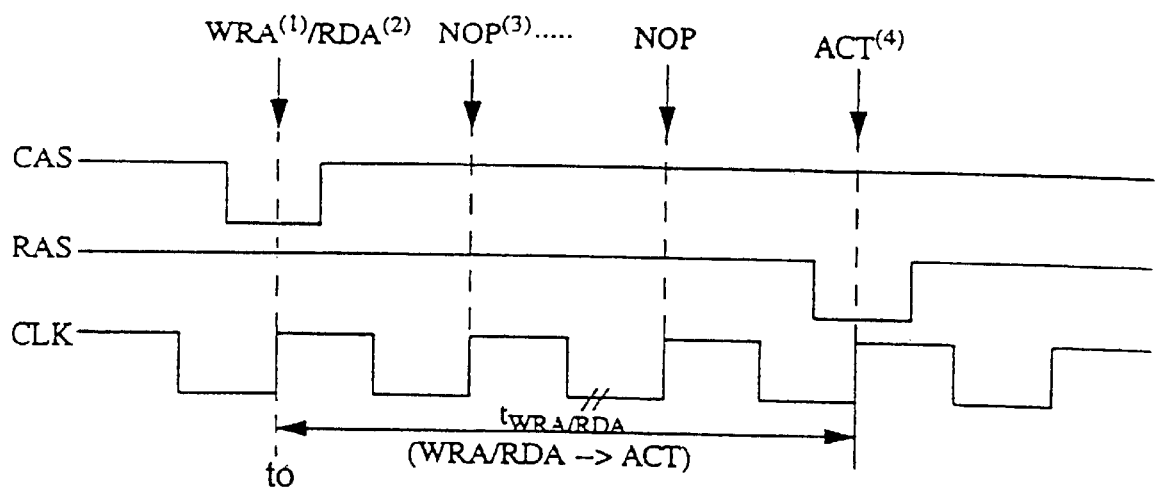
FIG. 3 is a timing diagram for explaining the read-write mode control with auto-precharging used in the prior art.

A waiting time $t_{WRA/RDA}$ defined for writing and reading with auto-precharging in FIG. 3 and described above is due to the delay occurring until the information to be written has reached the memory cell. However, the waiting time $t_{WRA/RDA}$ is only required in the write case but not in the read case.

In the method according to the invention for read-write mode control of the synchronous memory, especially a synchronous dynamic random access memory (SDRAM) or a synchronous graphics random access memory (SGRAM), using auto-precharging, the signal paths for the auto-precharging during reading and writing are run separately in the memory, in which the internal propagation times of the auto-precharging process for writing and for reading are configured differently.

A timing diagram for explaining the method according to the invention is shown in FIG. 1A. In the timing diagram no wait cycles (NOP) are inserted between the read instruction signal RDA with auto-precharging (the signal line CAS) and the associated activate signal ACT on the signal line RAS during a read process. As a result, shorter waiting times are produced between the read instructions applied to the memory chip by a memory controller and the associated activate signals, compared with the write case shown in FIG. 1b.

Figure 1B:
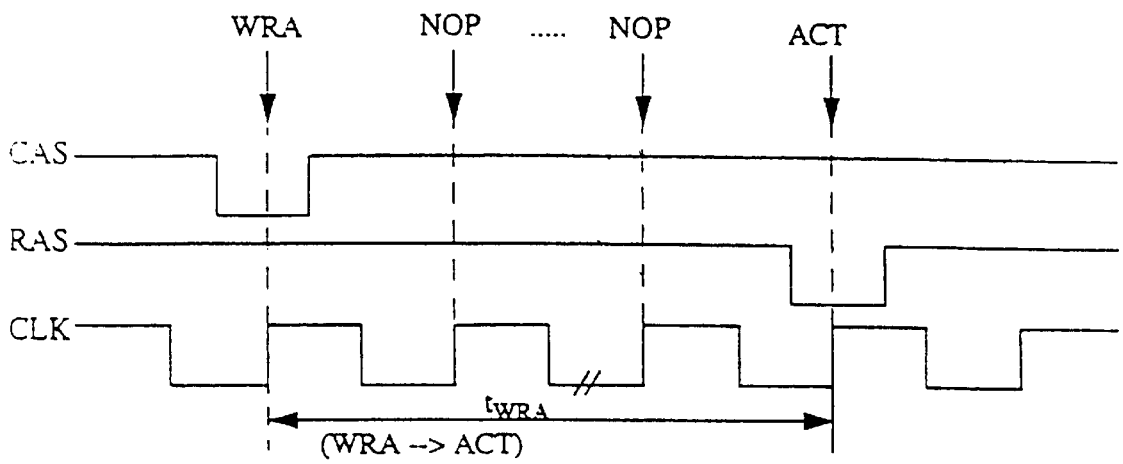
FIG. 1B is a pulse timing diagram, a time between a write process with auto-precharging and the associated activator signal.

The write case shown in FIG. 1b is controlled via the write signal path run separately from the read signal path in accordance with the invention. Exactly as in the case of the read-write mode control of known SDRAMs or SGRAMs shown in FIG. 3 and explained above, a number of wait cycles (e.g. two clock cycles of the clock CLK) are placed between the write instruction signal WRA and in each case the associated activate signal ACT in the write case.

Figure 2:
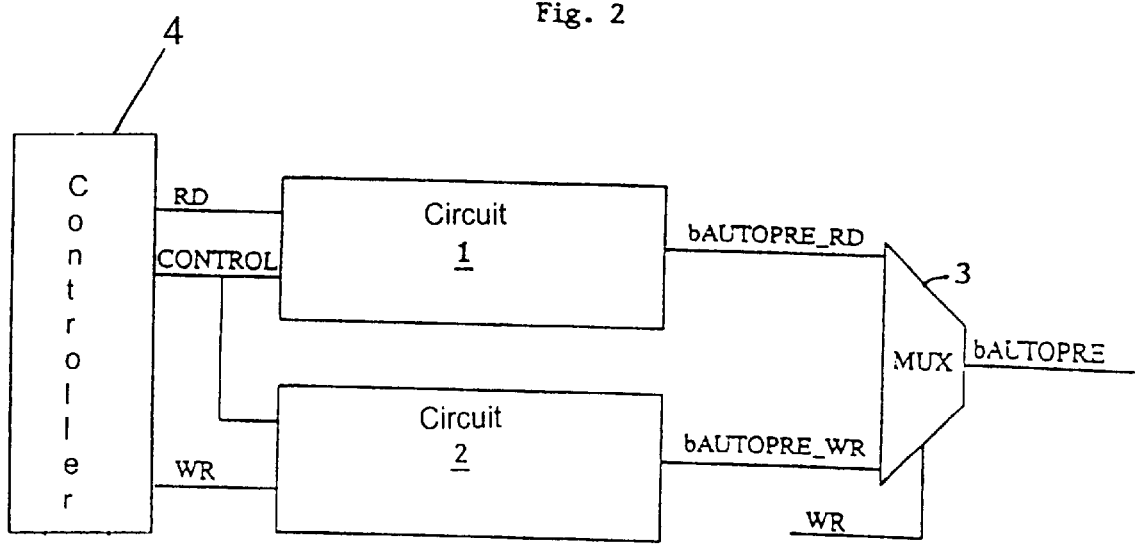
FIG. 2 is a block diagram of a preferred exemplary embodiment of a circuit configuration set up for carrying out the method, which can be integrated in an SDRAM or SGRAM.

FIG. 2 shows an exemplary embodiment according to the invention of a circuit configuration set up for carrying out the method according to the invention. A read signal RD and a control signal CONTROL are present at a first circuit part 1 for conducting and generating an auto-precharging signal for the read process. From this, the first circuit part 1 generates a signal bAUTOPRE_RD according to the invention without interposed wait cycles NOP. The signal bAUTOPRE_RD is present at a multiplexer 3.

A second circuit part 2 is used for conducting and generating the auto-precharging signal for the write process and, supplied with the control signal CONTROL, generates from a write signal WR a write signal bAUTOPRE_WR which is also present at the multiplexer 3. These two signals which are separately conducted and generated, are supplied as an auto-precharging signal bAUTOPRE to the respective memory cells by the multiplexer 3 controlled by the write signal WR. It must also be mentioned that the signals RD, WR and CONTROL are generated by a memory controller 4.

The additional circuit components and signal lines needed for separating the read path and the write path during the auto-precharging process in the circuit for carrying out the read-write mode control method according to the invention in the circuit configuration shown in FIG. 2, only have small space requirement and, therefore, can be easily integrated in the memory chip.

When the read-write mode control method according to the invention is used, in synchronous dynamic memories which are connected to a memory bank/row/word line, the bank/row/word line in which a write or read access took place is automatically closed by a read or write access with auto-precharging. Whereas the auto-precharging instruction is always executed a fixed time after the read or write instruction in conventional SDRAMs, a distinction is made between the read and write process in the concept according to the invention so that the memory bank/row/word line can be closed again more quickly after a read access and, as a result, unnecessary losses in performance are avoided.

We claim:

1. A method for read-write mode control of synchronous memories, including synchronous dynamic random access memories (SDRAMs) and synchronous graphics random access memories (SGRAMs), which comprises the steps of:
    providing a synchronous memory having separate signal paths running in the synchronous memory for auto-precharging for a reading process and for the auto-precharging for a writing process; and
    setting an internal propagation time of an auto-precharging process for the writing process different than the internal propagation time for the reading process so that the auto-precharging is supplied as early as possible to a memory cell in a read operation.

2. The method for read-write mode control according to claim 1, which comprises providing no wait cycles between a read instruction and an associated activate signal during the read operation.

3. The method for read-write mode control according to claim 1, which comprises providing a number of wait cycles between a write instruction and an activate signal during a write operation.

4. The method for read-write mode control according to claim 1, which comprises automatically closing a memory bank containing a number of synchronous memories in which a read-write access took place, by a read instruction with an earliest possible auto-precharge.

5. A circuit configuration for read-write mode control of a synchronous memory, including synchronous dynamic random access memories (SDRAMs) and synchronous graphics random access memories (SGRAMs), the circuit configuration comprising:

a first circuit part for conducting and generating a first auto-precharging signal for a reading process;

a second circuit part for conducting and generating a second auto-precharging signal for a writing process; and a multiplexer connected to said first circuit part and said second circuit part, said multiplexer combining the first auto-precharging signal and the second auto-precharging signal which were generated and conducted separately, in temporally separated positions for supplying an auto-precharge signal to a memory cell without wait cycles during the reading process.

6. The circuit configuration according to claim 5, including a memory controller for inserting the wait cycles between a write instruction signal and an associated write activate signal during the writing process, said memory controller connected to said first circuit part and to said second circuit part.

* * * * *